United States Patent [19]
Zollman et al.

[11] Patent Number: 4,604,519
[45] Date of Patent: Aug. 5, 1986

[54] INTENSIFIED CHARGE COUPLED IMAGE SENSOR HAVING AN IMPROVED CCD SUPPORT

[75] Inventors: James A. Zollman; William M. Kramer; James L. Rhoads, all of Lancaster, Pa.

[73] Assignee: RCA Corporation, Princeton, N.J.

[21] Appl. No.: 494,288

[22] Filed: May 13, 1983

[51] Int. Cl.[4] .............................................. H01J 40/14
[52] U.S. Cl. ............................... 250/213 VT; 313/528
[58] Field of Search ................... 250/213 VT; 357/74, 357/81, 24; 29/572, 589, 590; 313/528

[56] References Cited

U.S. PATENT DOCUMENTS

| | | | |
|---|---|---|---|
| 3,925,657 | 12/1975 | Levine | 250/211 J |
| 4,044,374 | 8/1977 | Roberts et al. | 357/80 |
| 4,178,528 | 12/1979 | Kennedy | 313/102 |
| 4,178,529 | 12/1979 | Kennedy | 313/102 |
| 4,266,334 | 5/1981 | Edwards et al. | 29/583 |
| 4,347,264 | 8/1982 | Lindmayer | 430/314 |
| 4,355,229 | 10/1982 | Zimmerman et al. | 250/213 VT |
| 4,443,653 | 4/1984 | Catalano et al. | 136/265 |
| 4,445,269 | 5/1984 | Pollard | 29/572 |

Primary Examiner—David C. Nelms
Assistant Examiner—James G. Gatto
Attorney, Agent, or Firm—Eugene M. Whitacre; Dennis H. Irlbeck; Vincent J. Coughlin, Jr.

[57] ABSTRACT

An intensified charge coupled image sensor comprises an image intensifier tube including an evacuated envelope having therein a photoemissive cathode, a charge coupled device spaced from said cathode, and a frame member for supporting the charge coupled device. The charge coupled device has a first surface and a second surface with a conductive boundary on the first surface. The frame member has a coefficient of expansion closely matching that of the charge coupled device and a first and second surface with a conductive pattern formed on one of the surfaces. The conductive boundary of the CCD and the conductive pattern of the frame member are in register and bonded together by a braze material to form a unitized structure of superior strength. The method of forming the conductive boundary and the conductive pattern is described as is the brazing method.

16 Claims, 11 Drawing Figures

INTENSIFIED CHARGE COUPLED IMAGE SENSOR HAVING AN IMPROVED CCD SUPPORT

The present invention relates to an intensified charge coupled image sensor and particulary to an improved support structure for a charge coupled device (CCD) disposed within such an image sensor.

BACKGROUND OF THE INVENTION

An intensified charge coupled image sensor comprises an image intensifier tube having a photoemissive cathode on an interior surface of an input window and a charge coupled device (CCD) located at the focal plane of the image intensifier tube. Such a structure is shown in U.S. Pat. No. 4,355,229 issued to H.S. Zimmerman et al, on Oct. 19, 1982. The Zimmerman et al. patent utilizes a CCD imager commercially available from RCA Corporation, Lancaster, Pa., and designated as the SID 52501. The CCD of the Zimmerman et al. patent, shown in FIGS. 1 and 2, includes an image array, known as an A register, a temporary storage array, known as a B register, and an output register, known as a C register. The B and C registers are usully masked, that is, means (not shown) are provided for preventing photoelectrons from the photoemissive cathode from reaching either register.

The A and B registers have channel stops (not shown) extending in the column direction to isolate the channels (the columns of the CCD) from one another. The electrodes (shown in FIG. 2) may be of the single layer type comprising, for example, N+ type regions of polysilicon separated by P−type regions of polysilicon. These electrodes extend in the row direction and, in the example illustrated, are three-phase operated. The electrodes are insulated from the relatively thick P−type substrate by a layer of silicon dioxide ($SiO_2$). The SID imager mentioned above has 320 columns and 512 rows (256 in the A register and 256 in the B register), each row comprising a group of three electrodes.

The operation of the CCD of FIG. 1 is well understood. During the so-called integration time, a scene or other image is projected onto the A register. The light or other radiant energy of the image causes charges to be produced at the various locations of the A register in accordance with the light intensity or energy density reaching the respective locations.

Upon the completion of the integration time (e.g., during the vertical blanking interval of commercial television), the charge signals which have accumulated (a "field") are transferred, in parallel, in the column direction from the A to the B register by the application of the multiple phase voltages $\phi_{A1} \ldots \phi_{A3}$ and $\phi_{B1} \ldots \phi_{B3}$. The charges subsequently are transferred a row at a time, from the B register to the C register, and after each row of charges reaches the C register, it is serially shifted out of the C register in response to the shift voltages $\phi_{C1} \ldots \phi_{C3}$. The transfer of charges from the B to the C register occurs during a relatively short time (the horizontal blanking time of commercial television, which is about 10 $\mu$s) and the serial shifting of the C register occurs at relatively high speed (during the horizontal line display time of commercial television). During the transfer of a field from the B to the C register, a new field may be integrated in the A register.

For a black and white CCD imager, the illumination of the A register occurs through the single layer electrode structure. However, if one desired to sense color information, then illumination in this way is not entirely suitable because the electrodes have high absorption at the blue end of the spectrum. For such a CCD imager, it is necessary to thin the substrate to a thickness of about 10$\mu$ (microns) and to illuminate through the back surface of the thinned substrate. When a CCD is used in an intensified charge coupled image sensor, it is also thinned to minimize lateral dispersion of the charges produced by the incident photoelectrons.

In one practical approach to thinning substrates, the number of CCD imager devices produced on a wafer is relatively small. First, using a two-inch wafer, up to three such devices, each about $0.5'' \times 0.8''$, as shown in FIG. 1, are fabricated at the same time on a common substrate, employing photolithographic techniques. Then two of the three devices are masked, that is, except for the back surface of the device being thinned, the entire wafer is coated with a substance (a "resist") which is not attacked by the chemical bath (an acid) used to thin the substrate. Then the entire wafer is immersed in the thinning bath and the wafer is spun about an axis passing through the center of the device being thinned. After the desired amount of thinning of the device is obtained, the wafer is removed from the bath, the resist is removed, and then the masking and other processing steps are repeated for each additional device. Then the wafer is cut apart in such a way that there is a thick substrate border surrounding the thin region of each device. This thick border provides some stiffness and mechanical support for the relatively fragile thinned substrate region of the A register (see FIG. 3).

While the process above has resulted in the production of many operational CCD's, it is not without its problems. One problem is that it is difficult to obtain uniform thinning throughout the entire imaging portion (A register) of the device. It is thought that because of the rectangular shape of the device, the acid bath sometime does not attack as strongly some of the edge and corner regions of the device as the center of the device and these edges and corners therefore are sometimes thicker in the final product than the center regions of the device. Such nonuniformity is undesirable as it sometimes causes nonuniformities in the picture information produced by the CCD. Also, as a practical matter, one cannot manufacture at the same time a large number of devices on the same wafer, even a large wafer. If one were to employ a larger wafer say 4" or 5" in diameter, there would be problems in spinning the wafer during thinning about an axis considerably displaced from the center of the wafer and therefore it would be difficult to utilize the outer edge portion of the wafer (recall that the axis about which the spinning takes place passes through the center of the region being thinned). In addition, the yield using this method is not as high as desired. Also, because of the fragility of the thinned substrate, it is very difficult to test the devices after they are thinned. The reason is that the test probes tend to cause the thinned substrate to become broken or otherwise damaged.

U.S. Pat. No. 4,266,334, issued to T. W. Edwards, et al., on May 12, 1981, and incorporated by reference herein for purpose of disclosure, describes a method which permits numerous thinned CCD imagers to be made on a single large wafer and then to be easily tested, cut out and mounted with little risk of breakage. In the Edwards et al. patent, a relatively large silicon wafer with proper doping is processed in the conventional way, using photolithographic techniques, to produce a relatively large number of CCD's on the common thick substrate. The front surface (the surface containing the electrodes) of the wafer may now be masked, for example, by placing it in a special masking fixture, or by employing a substance, such as a resist. The masking fixture or substance is made to cover the front surface (the one containing the electrodes) of the wafer and the peripheral edge of the back surface of the wafer. Now instead of thinning the individual devices one at a time, as in the previous process described above, the entire wafer is thinned in a rotary etching bath to the desired thickness over its entire center area, leaving only an unthinned rim around the peripheral edge of the wafer, for support, as shown in FIG. 4. Then a sheet of glass which fits into the thinned region is glued to the back surface, as shown in FIG. 5, to provide a laminated structure which is strong and rigid. The individual devices are then separated from one another by cutting through the glass and thinned substrate along lines between imagers.

The CCD's thinned by this method cannot be used directly in intensified charge coupled image sensors because the adhesive used to glue the sheet of glass into the thinned region of the wafer adversely affects the formation of the photoemissive cathode within the image intensifier tube, and the glass sheet and adhesive attentuate the electrons emitted from the photoemissive cathode preventing the electrons from entering the CCD. It is therefore necessary to remove the glass and adhesive from the device after testing and before the device can be mounted within the image intensifier tube. To remove the glass, the wafer containing a number of CCD's is placed into a holder which is shown in FIG. 6 and which prevents the electrode side of the CCD's from contacting the etchant. A combination of $H_2SO_4$ and HF acids are put into the top section of the holder to etch the glass sheet. The CCD's are then sectioned from the wafer. The CCD, having a thickness of about 10 micrometers is fragile and therefore difficult to handle and mount in the image sensor. The Zimmerman et al. patent discloses that support springs are used to contact the CCD and retain it against a suitable CCD holder plate; however, the mechanical contacts provided by the Zimmerman et al. structure are unreliable and sometimes causes damage to the CCD. Also, the high temperature bakeout of the image sensor prior to the formation of the photoemissive cathode frequently causes the CCD to break because of the thermal mismatch between the CCD and the metal holder plate and contacts.

SUMMARY OF THE INVENTION

An intensified charge coupled image sensor comprises an image intensifier tube including an evacuated envelope having therein a photoemissive cathode, a charge coupled device spaced from said cathode, and support means for supporting said charge coupled device. The charge coupled device has a first surface and a second surface with a conductive boundary on the first surface. The support means comprises a frame member having a coefficient of expansion closely matching that of the charge coupled device. The frame member has a first and a second surface witha conductive pattern on one of the surfaces of the frame member. The conductive boundary on the surfaces of the charge coupled device and the conductive pattern of the frame member are in register, and bonding means secures the conductive pattern of said frame member to said conductive boundary of said charge coupled device to strengthen and support said device.

DETAILED DESCRIPTION OF THE PREFERRED EMBODIMENT

Figure 1:
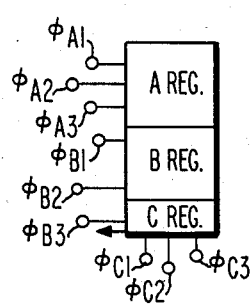
FIG. 1 is a schematic representation of a known charge coupled device (CCD) imager of the field transfer type.
Figure 2:
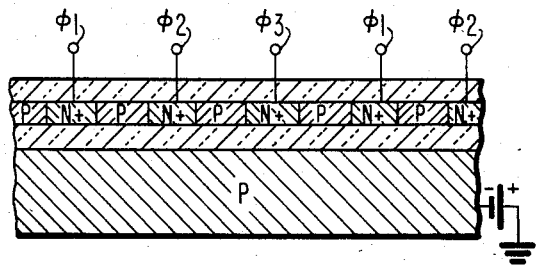
FIG. 2 is a section through the imager of FIG. 1 showing the electrode structure.
Figure 3:
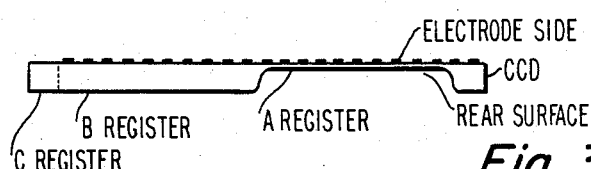
FIG. 3, is a side view of a CCD imager having a thinned A register.
Figure 4:
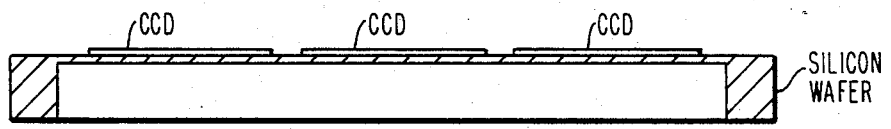
FIG. 4 is a sectional view of a silicon wafer containing a number of thinned CCD imagers.
Figure 5:
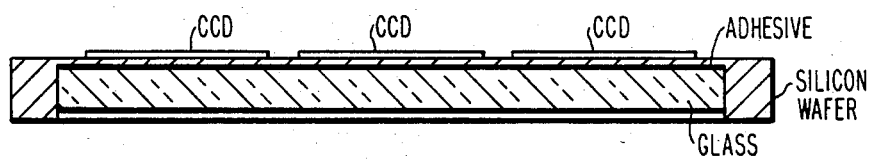
FIG. 5 is a sectional view of a silicon wafer having a sheet of glass glued into the thinned region thereof.
Figure 7:
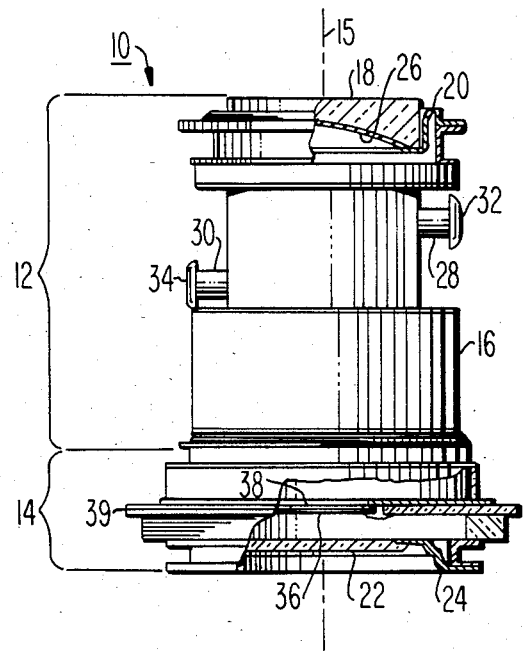
FIG. 7 is an elevational view, partially in section, of an intensified charge coupled image sensor.

An intensified charge coupled image sensor 10 is shown in FIG. 7. The sensor 10 comprises an inverter image intensifier section, generally indicated as 12 and a header assembly, generally designated as 14. An optical axis, 15, extends longitudinally along the center line of the sensor 10.

The image intensifier section 12 comprises a substantiallly cylindrical vacuum envelope 16 which may be of glass-metal or ceramic-metal construction. For maintaining close dimensional tolerances, ceramic-metal construction is preferred. The envelope 16 is closed at one end by a transparent faceplate 18, which preferably comprises a plano-concave fiber optic member sealed to a conductive cathode flange 20. A glass window 22, which is sealed to a conductive window flange 24, closes the other end of the envelope 16. A photoemissive cathode 26 for emitting electrons in a pattern corresponding to the intensity of radiation incident thereon is formed on the interior surface of the faceplate 18 by introducing the constituent materials into the envelope 16 through a processing tubulation 28. The formation of photocathodes is well known in the art and is described, for example, in U.S. Pat. No. 3,658,400 issued to F. A. Helvy on Apr. 25, 1972 and incorporated by reference herein for the purpose of disclosure. An exhaust tubulation 30 provides a means for removing occluded gases from within the envelope 16 during the processing of the image sensor 10. The tubulations 28 and 30 are formed of copper and are shown as being "tipped-off", i.e., cold-welded by crimping. Tip-off protectors 32 and 34 are attached to the ends of the "tipped-off" tubulation 28 and 30, respectively, to protect the tip-offs from damage.

The header assembly 14 includes a silicon charge coupled device (CCD) 36 which is spaced from the cathode 26 and located in the focal plane, i.e., a plane substantially orthogonal to the optical axis 15 of the image sensor 10 where the photoelectrons from the photoemissive cathode 26 are focused. The CCD 36 has a thickness of about 10 microns. A novel frame member 38 formed from silicon and having a thickness of about 0.13 to 0.25 mm (5 to 10 mils) is secured to the CCD 36 to strengthen and support the CCD and is located on the cathode side of the CCD. While a thickness within the range of 0.13 to 0.25 mm is preferred, the range is not to be considered as limiting and thinner or thicker frame members may be used. The header assembly 14 also includes a ceramic header member 39 which has an electrode pattern (not shown) formed thereon to permit electrical contact to be made to the electrode of the CCD 36. The electrode pattern is formed in a multilayered structure that passes through the vacuum envelope 16 of the sensor 10 so that external contacts (not shown) are provided on the header member 39 to the CCD 36. The header structure is disclosed in U.S. Pat. No. 4,335,229 referenced above and incorporated herein for the purpose of disclosure.

Figure 6:
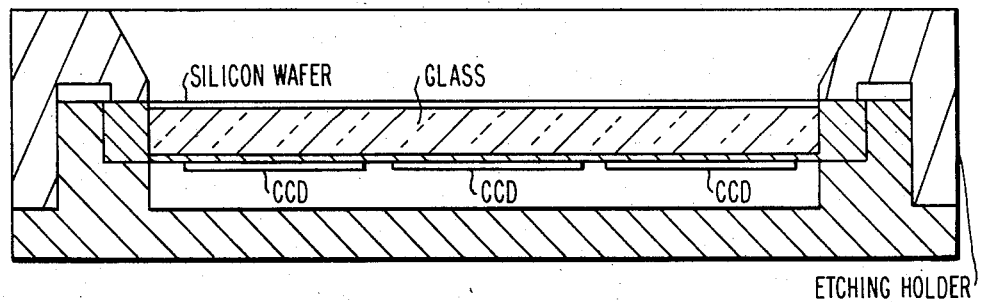
FIG. 6 shows a silicon wafer containing a number of thinned CCD imagers support in an etching holder.
Figure 8:
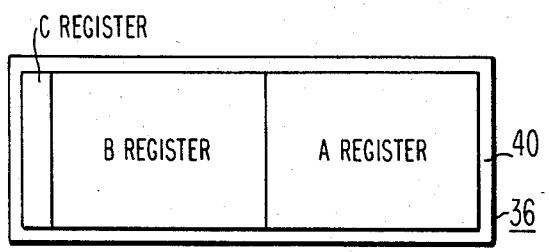
FIG. 8 is an enlarged elevational view of a CCD having a conductive boundary formed on one surface thereof.

The CCD 36 differs from the CCD described in the aforementioned U.S. Pat. No. 4,266,334 to Edwards et al. in that a novel conductive boundary 40 is formed on the rear surface of the device 36 beyond the A, B and C registers. The boundary 40 is shown in FIG. 8. In order to form the boundary 40, the glass sheet and adhesive are removed from the thinned surface of the silicon wafer using the wafer holder shown in FIGS. 6 and the acid etch described in the background of the invention. The wafer is then washed to remove all trace of the acid. The process to this point is conventional and is used to produce CCD's for use in intensified charge coupled image sensor. The novel process includes applying a layer of photoresist to the back surface (thinned side) of the wafer. The photoresist layer used in this example is marketed under the name Shipley 1350B by Shipley Company, Newton, Mass. The photoresist is exposed to actinic radiation, as by photographic projection or contact exposure, whereby there are produced in the photoresist layer regions which are more soluble and regions which are less soluble in a particular developer. The photoresist layer, in this example, being positive acting is soluble in the region corresponding to the boundary of the device. With the photoresist removed from the boundary of the CCD 36, the CCD is placed in an evaporation chamber (not shown) capable of attaining a vacuum of at least $1 \times 10^{-5}$ torr. A first layer 42 of conductive material, such as chromium, is deposited at a rate of 150 angstroms (Å) per minute onto the thinned surface of the wafer (back surface of the CCD) until a thickness ranging from about 700 Å to 2500 Å is obtained, although a thickness of 1400 Å is preferred. Without interrupting the vacuum, a second layer 44 of a conductive material, such as gold, is deposited at a rate of 30 angstroms per minute onto the first conductive layer 42 until a thickness ranging from about 750 Å to 2000 Å is obtained, although a thickness of about 1000 Å is preferred. The CCD 36 is removed from the vacuum chamber and immersed in Acetone or an equivalent photoresist solvent until the photoresist and the layers of chromium and gold overlying the A, B and C registers are removed leaving only the conductive boundary 40 comprising layers 42 and 44 on the back surface of the CCD 36.

Figure 9:
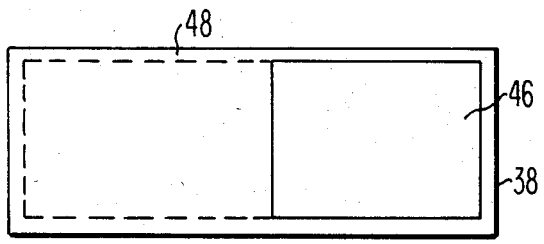
FIG. 9 is an enlarged elevational view of a novel frame member having a conductive pattern formed on one surface thereof.
Figure 10:
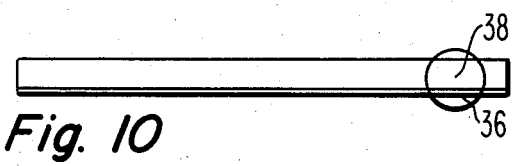
FIG. 10 is an enlarged side elevational view showing the CCD bonded to the frame member.
Figure 11:
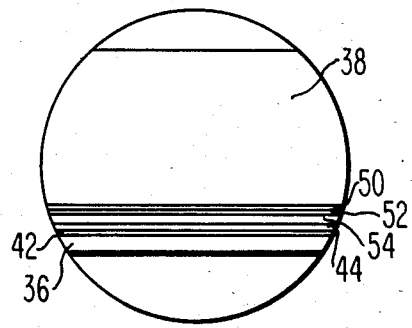
FIG. 11 is a greatly enlarged view of the structure shown within the circle of FIG. 10.

The frame member 38, shown in FIG. 9, is laser cut, impact ground or similarly formed from a silicon wafer having a thickness of about 0.13 to 0.25 mm (5 to 10 mils) to have a rectangular shape with a length and width substantially equal to that of the CCD 36. An aperture 46, slightly smaller in length than the A register of the CCD 36, is formed through two opposed major surfaces of the frame member 38. The aperture 46 permits photoelectrons from the cathode to impinge upon the imaging area (A register) to the CCD 36. The unapertured portion of the frame member 38 shields the B and C registers of the CCD from electron impingement. A conductive pattern 48, comprising two overlying conductive layers 50 and 52 is formed around the perimeter of one major surface of the frame member 38. The pattern 48 is configured to conform, at least in part, to the conductive boundary 40 formed on the CCD 36, however, the pattern 48 may occupy the entire major surface of the frame member.

If it is desired to restrict the conductive pattern 48 to the perimeter of the one major surface of the frame member 38, a layer of Shipley 1350B photoresist is exposed to actinic radiation, as by photographic projection or contact exposure, whereby there are produced in the photoresist layer regions which are more soluble and regions which are less soluble in a particular developer. The photoresist layer being positive acting is soluble around the perimeter of the frame member 38 corresponding to the boundary 40 of the CCD 36. With the photoresist removed from the perimeter of the frame member 38, the frame member is then placed into the evaporation chamber (not shown) and two layers of conductive material are sequentially deposited onto one surface of the silicon frame member without interrupting the vacuum to form a conductive pattern 48. The first layer 50, preferably of chromium, is deposited at a rate of 150 Å per minute until a thickness ranging from about 700 Å to 2500 Å is obtained, although a thickness of 1400 Å is preferred. The second layer 52, preferably of gold, is deposited onto the first layer 50 of chromium at a rate of 30 Å per minute until a thickness ranging from about 750 Å to 2000 Å is obtained, although a thickness of about 1000 Å is preferred. The frame member 38 is removed from the vacuum chamber and immersed in Acetone or an equivalent photoresist solvent until the photoresist covering the interior portion of the one major surface and the overlying layers of chromium and gold on the photoresist are removed.

In the event that it is desired to form the pattern 48 on the entire one major surface of the frame member 38, the layers of chromium and gold may be deposited directly on the one major surface as previously described herein, and the aperture 46 may be formed either before or after the evaporation of the layers 50 and 52.

The CCD 36 having the conductive boundary 40 and the frame member 38 having the conductive pattern 48 are aligned in facing relationship with a 0.01 to 0.025 mm (0.4 to 1 mil) thick shim of brazing solder 54 disposed between the conductive boundary 40 and the conductive pattern 48. The preferred brazing material contains about 95 percent tin and 5 percent antimony, by weight. The conductive boundary 40 on the CCD 36 and the conductive pattern 48 on the frame member 38 are maintained in register by means of a brazing fixture (not shown). The components are vacuum brazed together in a suitable vacuum furnace (not shown) at temperatures ranging from about 250° C. to 400° C., although a brazing temperature of about 380° C. is preferred.

A CCD 36 attached to a frame member 38 as described herein has greater strength and structural support than a CCD without a supporting frame. Since the frame member 38 is made of silicon, the same material used to make the CCD 36, the coefficient of thermal expansion of both tube elements is identical and the CCD 36 is less likely to break during the high temperature bake-out of the image sensor that is required to activate the photoemissive cathode 26.

What is claimed is:

1. In an intensified charge coupled image sensor of the type comprising:

an image intensifier tube including an evacuated envelope having therein a photoemissive cathode for emitting electrons in a pattern corresponding to the intensity of radiation incident thereon, a header assembly including a header member, a charge coupled device spaced from said cathode, said device having a first surface and a second surface, and support means for supporting said device within said header member, wherein the improvement comprises said charge coupled device having a conductive boundary on said first surface, said support means comprising a discrete frame member having a coefficient of expansion identical to that of the charge coupled device, said frame member having a first and a second major surface with a conductive pattern on one of said major surfaces in register with the conductive boundry of said charge coupled device, said frame member being disposed between said cathode and said charge coupled device and having an aperture therein to permit the electrons from said cathode to impinge upon said charge coupled device, and bonding means for securing said conductive pattern of said frame member to said conductive boundary of said charge coupled device, thereby attaching said frame member to said charge coupled device to strengthen and support said charge coupled device.

2. The image sensor of claim 1, wherein said conductive boundary on said first surface of said charge coupled device and said conductive pattern on one of said major surfaces of said frame member comprises chromium and gold.

3. The image sensor of claim 2, wherein said conductive boundary and said conductive pattern include a first layer of chromium and an overlying layer of gold.

4. The image sensor of claim 1, wherein said frame member comprises silicon.

5. The image sensor of claim 1, wherein said bonding means includes a braze material comprising tin and antimony.

6. The image sensor of claim 5, wherein said braze material comprises 95 percent tin and 5 percent antimony, by weight.

7. In an intensified charge coupled image sensor of the type comprising:

an image intensifier tube including an evacuated envelope having a longitudinally extending optical axis, a photoemissive cathode within said envelope for emitting electrons in a pattern corresponding to the intensity of radiation incident thereon, a header assembly including a header member, a silicon charge coupled device having a thickness of about 10 microns spaced from said cathode and disposed within said header member in a plane substantially orthogonal to said optical axis, said charge coupled device having a first surface and a second surface, said charge coupled device including an imaging area, an output register and a plurality of electrodes disposed on said second surface of said charge coupled device, and support means for supporting said charge coupled device within said header member, wherein the improvement comprises said charge coupled device having a conductive boundary around said first surface, said boundary comprising chromium and gold, said support means including a discrete frame member of silicon having a thickness substantially greater than the thickness of said charge coupled device, said frame member having a first major surface and a second major surface, said frame member being disposed between said cathode and said charge coupled device, said frame member having a conductive pattern on one of the major surfaces in register with said conductive boundary on said first surface of said charge coupled device, said frame member having an aperture therethrough to permit electrons from said cathode to impinge upon said imaging area of said charge coupled device, and a braze material disposed between said conductive boundary of said charge coupled device and said conductive pattern on said frame member to secure and support said charge coupled device against said frame member.

8. The image sensor of claim 7, wherein said charge coupled device includes a storge register which is shielded from electron impingement by an electron impervious portion of said frame member.

9. The image sensor of claim 7, wherein said conductive boundary on said first surface of said charge coupled device and the conductive pattern on said second surface of said frame member comprise chromium and gold.

10. The image sensor of claim 9, wherein said conductive boundary and said conductive pattern include a first layer of chromium and an overlying layer of gold.

11. The image sensor of claim 7, wherein said braze material comprises tin and antimony.

12. The image sensor of claim 11, wherein said braze material comprises 95 percent tin and 5 percent antimony, by weight.

13. A charge coupled device structure comprising a charge coupled device having a uniform thickness, said charge coupled device having a first surface and a second surface, said charge coupled device including an imaging area, an output register and a plurality of electrodes disposed on said second surface, said charge coupled device having a conductive boundary around said first surface beyond said imaging area and said output register, a discrete frame member having a thickness substantially greater than the thickness of said charge coupled device and a coefficient of expansion identical thereto, said frame member having a first and a second major surface with a conductive pattern on one of said major surfaces, said conductive pattern on said frame member being in register with said conductive boundary on said charge coupled device, said frame member having an aperture therethrough to expose at least a portion of said imaging area of said charge coupled device to radiation incident thereon, and a braze material disposed between said conductive boundary of said charge coupled device and said conductive pattern on said frame member to secure and support said charge coupled device against said frame member.

14. The charge coupled device structure of claim 13, wherein said charge coupled device and said frame member comprise silicon.

15. The charge coupled device structure of claim 14, wherein said conductive boundary on said first surface of said charge coupled device and said conductive pattern on said frame member comprise chromium and gold.

16. The charge coupled device stucture of claim 15, wherein said braze material comprises tin and antimony.

* * * * *